United States Patent
Pan

(10) Patent No.: US 7,492,214 B2
(45) Date of Patent: Feb. 17, 2009

(54) ANALOG VOLTAGE GENERATOR WITH SELF-BIASED CAPACITIVE FEEDBACK STAGE

(75) Inventor: Feng Pan, Richmond, CA (US)

(73) Assignee: SanDisk Corporation, Milpitas, CA (US)

( * ) Notice: Subject to any disclaimer, the term of this patent is extended or adjusted under 35 U.S.C. 154(b) by 50 days.

(21) Appl. No.: 11/618,918

(22) Filed: Jan. 1, 2007

(65) Prior Publication Data

US 2008/0157824 A1    Jul. 3, 2008

(51) Int. Cl.
    *G05F 1/10* (2006.01)
(52) U.S. Cl. .................................................. 327/538
(58) Field of Classification Search ................ 327/530, 327/534, 535, 538, 543
    See application file for complete search history.

(56) References Cited

U.S. PATENT DOCUMENTS

| | | | |
|---|---|---|---|
| 5,352,972 A | * | 10/1994 | Pernici et al. ............... 323/313 |
| 5,563,504 A | * | 10/1996 | Gilbert et al. ............... 323/316 |
| 6,101,118 A | | 8/2000 | Mulatti et al. |
| 6,424,585 B1 | | 7/2002 | Ooishi et al. |
| 6,894,928 B2 | | 5/2005 | Owen et al. |
| 7,112,948 B2 | * | 9/2006 | Daly et al. ................... 323/316 |
| 2008/0024096 A1 | | 1/2008 | Pan |
| 2008/0157731 A1 | | 7/2008 | Pan |

OTHER PUBLICATIONS

International Search Report mailed Jun. 12, 2008, for International Application No. PCT/US2007/089072.
Written Opinion of the International Searching Authority mailed on Jun. 12, 2008, for International Application No. PCT/US2007/089072.

* cited by examiner

*Primary Examiner*—Jeffrey S Zweizig
(74) *Attorney, Agent, or Firm*—Brinks Hofer Gilson & Lione

(57) ABSTRACT

Analog voltage drain with reduced current drain is achieved by a new capacitive-divided feedback architecture. During the operational phase an op amp monitors a capacitively-divided fraction of the output voltage, and drives a current sink or source accordingly; during an initial phase the output is forced to the correct value by a different circuit, while the opamp is connected to self-tune itself in a way which removes DC offset effects.

20 Claims, 6 Drawing Sheets

Normal Way of Generating Analog Voltage With Resistor and Biasing Current
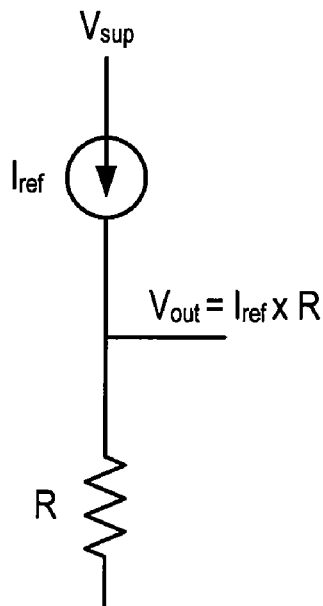
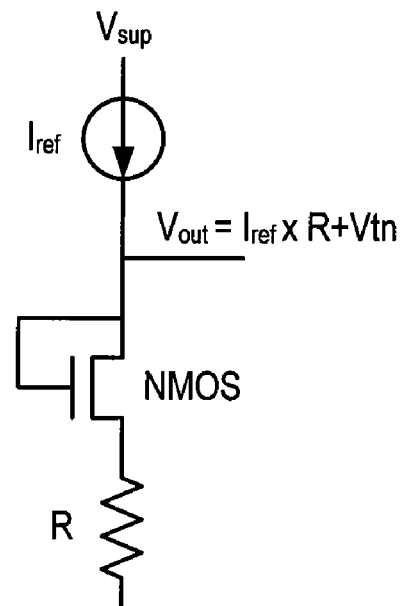
FIG. 1
(Prior Art)

Modified Way of Generating Analog Voltage Level Lower than Vcc

- Ideally the feedback control signal can be used to drive some pull up and pull down circuits to maintain the analog voltage level;

- For certain cases that analog voltage could be within a given boundary. Upper and Lower boundaries can be detected using the same approach. The operation is described as below

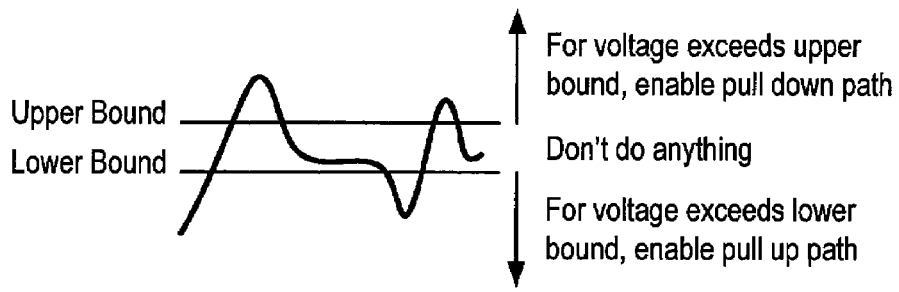

For voltage exceeds upper bound, enable pull down path

Don't do anything

For voltage exceeds lower bound, enable pull up path

3. The target of design is to use capacitive divider method to completely remove the DC path used for biasing. Design has to make sure the power consumption of amplifiers has to be smaller than the case of voltage generation with direct DC biasing current

FIG. 4

ANALOG VOLTAGE GENERATOR WITH SELF-BIASED CAPACITIVE FEEDBACK STAGE

BACKGROUND

1. Technical Field

The present application relates to analog voltage generation, and more particularly to low-power generation of many different desired voltages on a nonvolatile memory integrated circuit.

2. Related Art

Many portable electronic systems are critically limited by battery life. For example, users do not like heavy cell phones, but users also do not like their cell phones to run out of power and shut down. One way to improve battery life is to increase the energy efficiency of the electronics components in the portable system.

As the constraints of low-power integrated circuits have steadily become tighter, the pressure on voltage management has similarly tightened. Power consumption issues, as well as the normal progress of voltage scaling, push designers toward tighter management of voltages on-chip. Accurate power-valid thresholds, or voltage margins which are dynamically determined in a multi-interface chip, are examples of this.

The availability of power island design techniques also means that reference voltages for the particular needs of a particular power island may be demanded.

Modern nonvolatile memory development is turning into one of the most rapidly advancing areas in the semiconductor industry. Memory cell technology itself continues to advance, even within the general areas However, since the transistor operations are inherently not digital, a variety of reference levels are likely to be needed by memory designs. Thus the capability for generation of secondary analog voltages on chip is important.

The bandgap voltage reference circuit is one of the mainstays of analog electronics, and provides a very reliable on-chip reference. However, this circuit topology, in its many variations, is generally limited to one specific output voltage, and consumes power. It is therefore generally preferable not to use more than one bandgap reference circuit per chip.

The case of a low-power nonvolatile memory module is the convergence of the above requirements. Many different voltages must be made available on chip, and yet static power consumption in the various voltage generation stages is extremely undesirable.

As shown in FIG. 1, a current source, mirrored from elsewhere on chip, can be combined with a voltage-drop or ohmic element to give a reference voltage output. However, this approach has a constant power loss of the regulated voltage times the reference current squared.

A pending U.S. patent application (U.S. Pat. No. 11/497, 465, filed Jul. 31, 2006, titled "Hybrid Charge Pump Regulation") by the same inventor noted the advantages of a capacitive divider in the feedback loop of a voltage generator circuit. In this example, as illustrated in FIG. 2, the op amp shown at the right of the diagram drives the charge pump shown at the top left, to maintain the output at a level which is equal to the reference voltage Vref times the capacitive ratio.

In the circuit of FIG. 2, the "div" node is pulled down to ground during the initial phase. After the initial phase the op amp drives the charge pump to make node div equal to Vref, so the output voltage is driven towards Vref times the capacitor ratio (C1+C2)/C2. Note that the output voltage is directly dependent on the capacitor ratio, so process variation, geometric effects, and parasitic capacitance effects can all affect the output voltage.

The present application discloses a significant improvement to that circuit.

BRIEF SUMMARY

The present application discloses new approaches to analog voltage generation using active control without DC current consumption. A conventional leg sets an initial correct voltage value on an output terminal, and a differential stage (e.g. an op amp) is placed in a metastable state at this correct voltage value. The result of this is surprising: the differential stage's connection during startup assures that it will be at its optimal operating point.

The disclosed innovations, in various embodiments, provide one or more of at least the following advantages:

Reduce static current drain
More accurate analog voltage generation
Reduced power consumption
Simpler system architecture
Ability to provide a larger number of voltage levels within a given power budget
Smaller layout. This is possible because the ratio of the capacitors themselves is not as critical in determining the operating point, according to the present invention, so it is no longer necessary to use very large capacitors if a precision ratio is required.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 1 schematically shows a conventional reference voltage generation stage with large static power consumption.

FIG. 4 shows how two complementary drivers can be used to provide voltage control with a deadband.

DETAILED DESCRIPTION OF THE PREFERRED EMBODIMENTS

The numerous innovative teachings of the present application will be described with particular reference to presently preferred embodiments (by way of example, and not of limitation).

Figure 3:
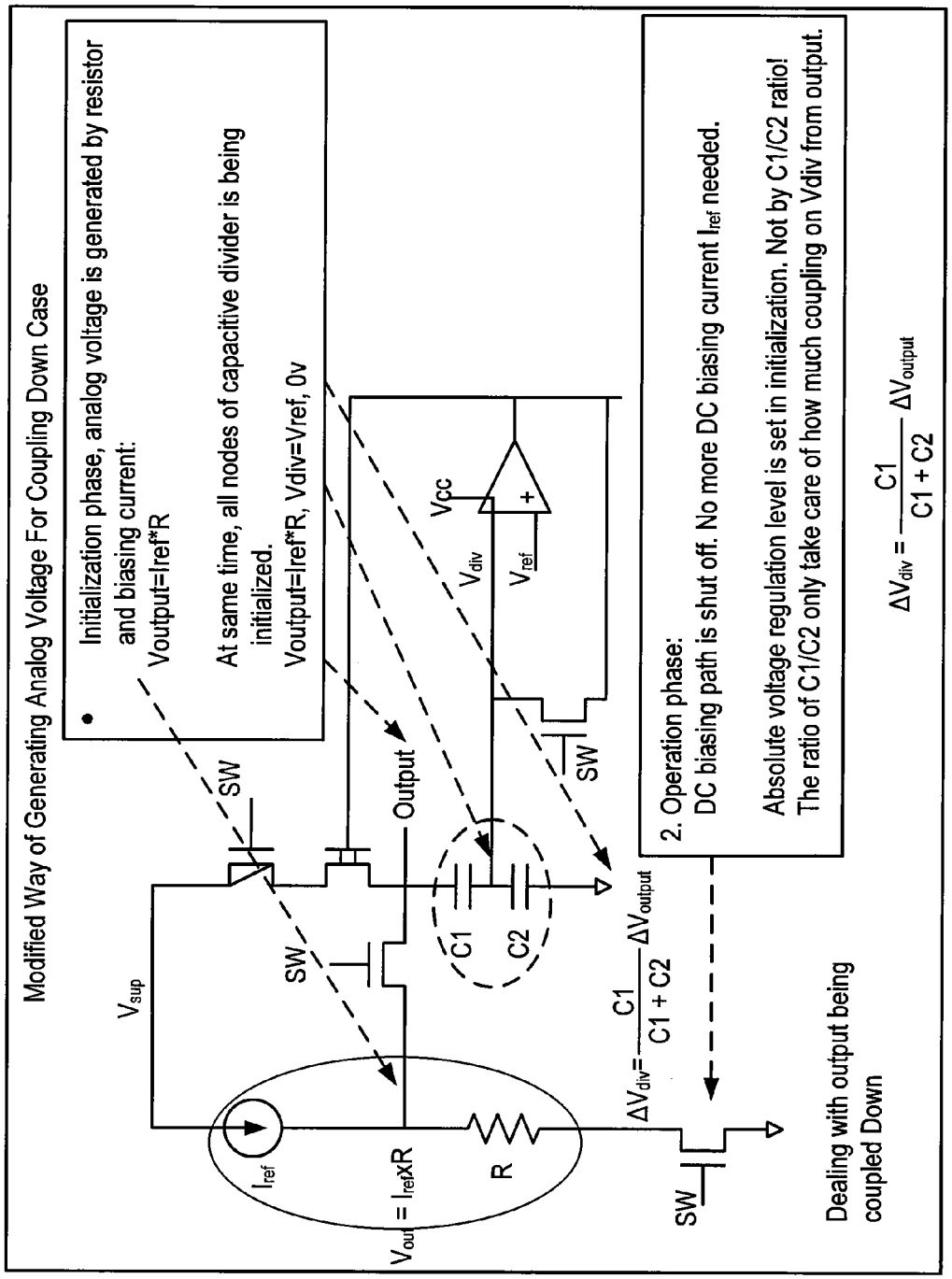
FIG. 3 shows a first sample embodiment of a new circuit, in which a conventional stage is used to set the output voltage, while a differential stage self-tunes itself by connection to the correct output voltage. Note that the output node is not necessarily connected to any external load at this time.

FIG. 3 shows a first sample embodiment of a new circuit, in which a conventional stage is used to set the output voltage, while a differential stage self-tunes itself by connection to the correct output voltage. Note that the output node is not necessarily connected to any external load at this time.

During the startup phase (SW driven high), the reference current Iref and the load R drive the output node to approximately IrefR. (If signal SW is well above this value, there will not be a diode drop.) Because the output of the op amp is now connected back to its input (and to node div), the op amp will drive Vdiv to be equal to Vref. Note that SW also gates a PMOS, to assure that the op amp is not able to drive the output node at this time.

After the startup phase (SW low), the IrefR stage is shut off and disconnected, so its power consumption stops. The op amp now drives a pull-up transistor to keep Vdiv=Vref, and hence can respond to changing loads on the output line very rapidly. Since Vdiv was equal to Vref during initialization, and since variations on the output node should be cancelled out by the op amp and current source, the output node will stay at the same value it had during initialization. Thus the output voltage is no longer depending on the ratio of capacitors.

The circuit of FIG. 3 shows a pull-up configuration, so this circuit would not be able to offset overvoltage at the output. One way of limiting voltage to a desired range, as shown in FIG. 4, is to combined a pull-up active stage with an analogous pull-down active stage. However, it is preferable that the two stages do not have the same setpoint, for stability.

Figure 5:
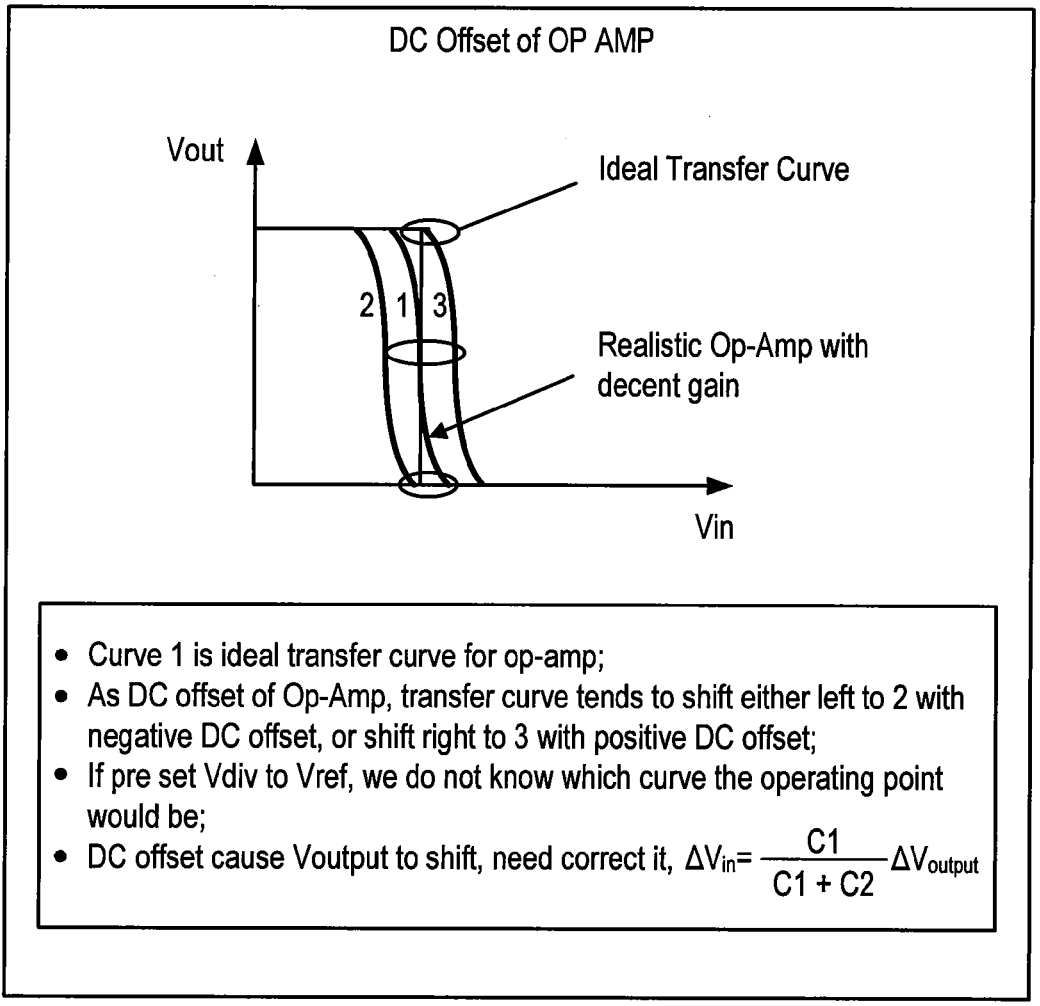
FIG. 5 shows how an op amp has multiple possible operating curves, depending on the DC offset of that particular op amp.

FIG. 5 shows a family of op amp transfer curves. The ideal op amp can be thought of as an infinite-gain differential amplifier, so the ideal transfer curve would show a step function at the output=input point. However, a realistic op amp transfer curve will have some curvature, as do the three parallel curves shown.

Figure 2:
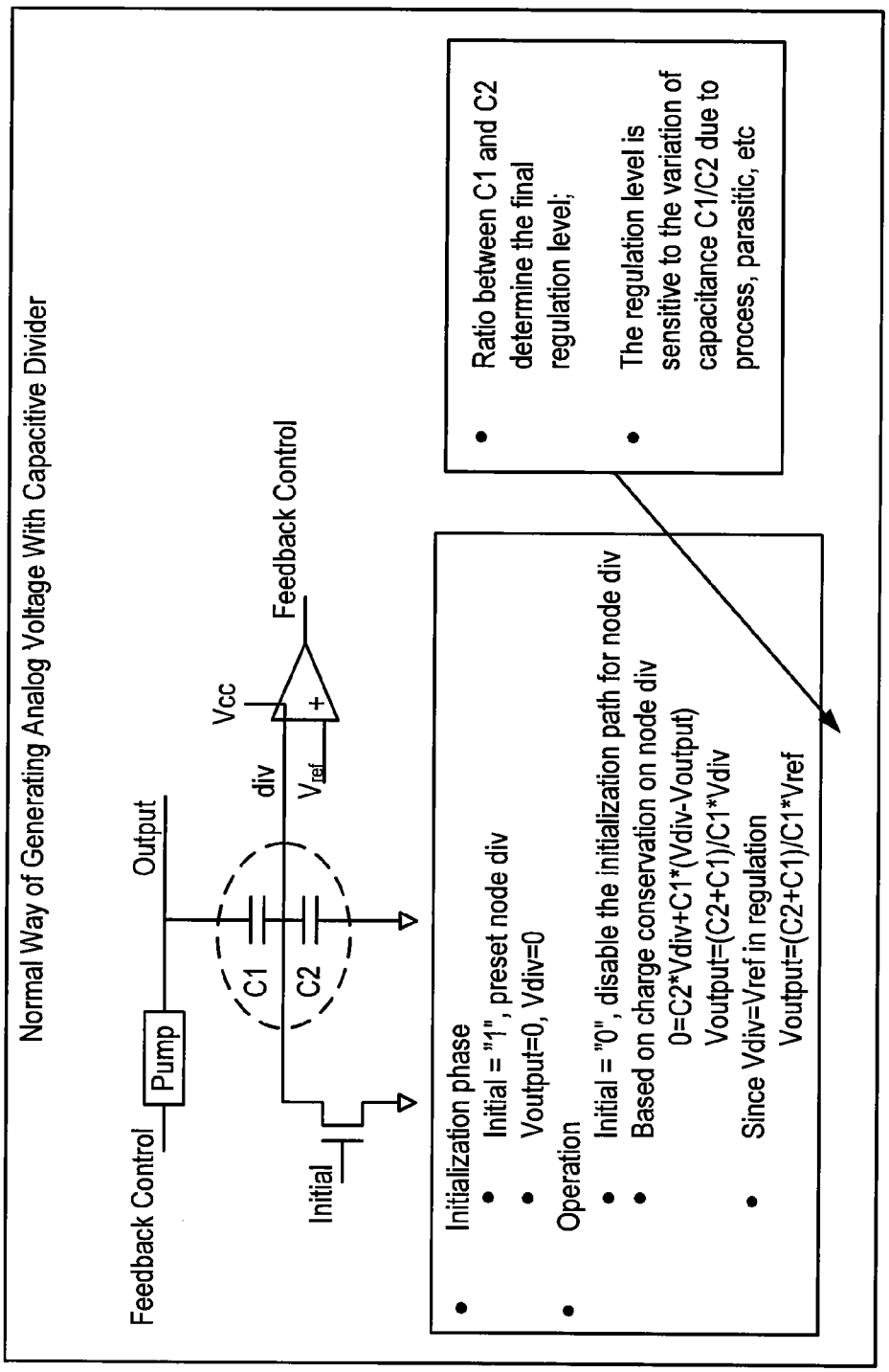
FIG. 2 shows a circuit, having the same inventor as named in the present application, which uses a differential stage to drive an output note to a desired level, which is set by a ratio of capacitors and a reference voltage.

These curves are parallel because they illustrate an inherent difficulty of op amps, namely uncertain DC offset. As the three oval blobs show, merely setting the input voltage does not tell us which operating curve is the correct one. This makes a difference in the circuit of FIG. 2, because the DC offset voltage, multiplied by the capacitor ratio, translates to a DC error component on the output node.

Figure 6:
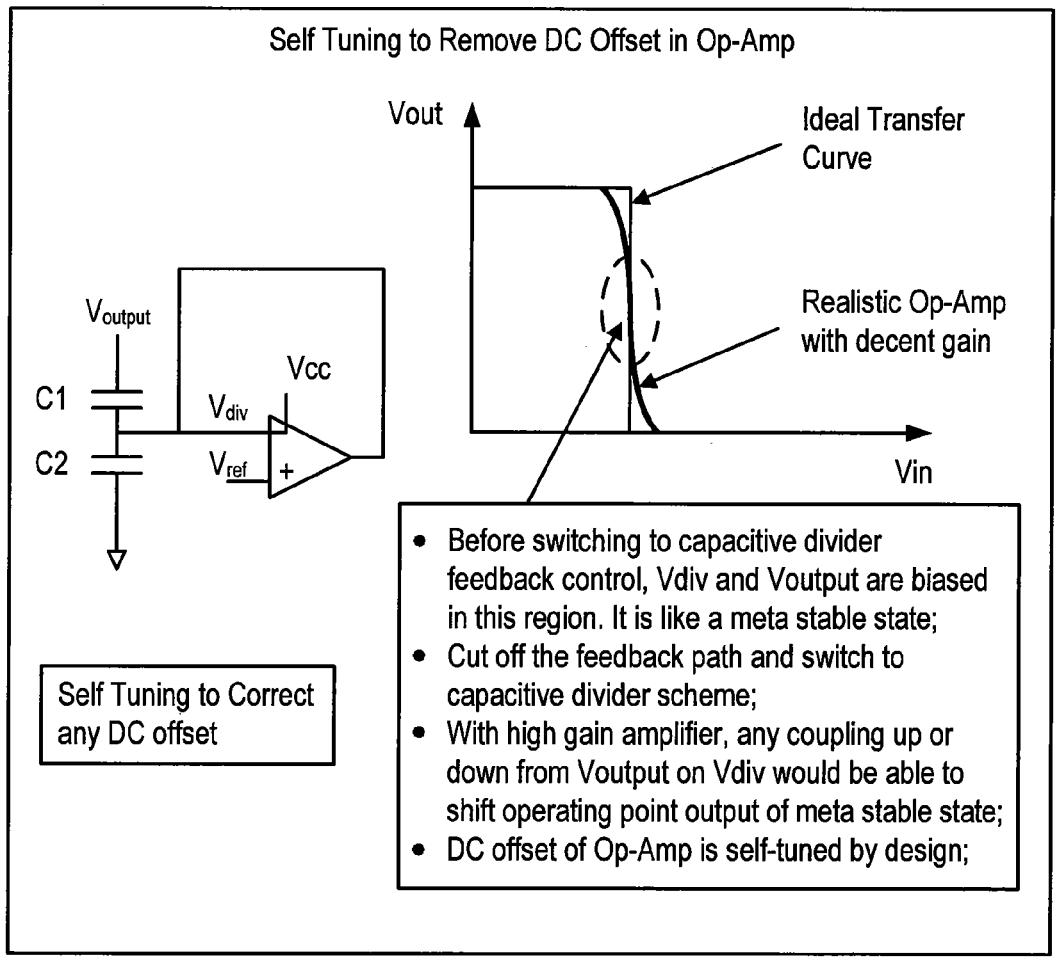
FIG. 6 shows how the self tuning effect of a circuit like that of FIG. 3 sets a desired operating point, and eliminates the bad effects of DC offset and capacitor ratio.

FIG. 6 shows how the self tuning effect of a circuit like that of FIG. 3 sets a desired operating point, and eliminates the bad effects of DC offset and capacitor ratio. The dotted line shows how the op amp has been forced to a metastable starting point on its operating curve; this assures that the op amp will respond optimally to transient loading on the output node. The uncertain DC offset of the op amp has been cancelled out.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

For example, additional feedback relations can be added into the illustrated circuit topology if desired, or other conditioning superimposed if desired.

For another example, pass gates can be used if needed to avoid diode drops.

For another example, other circuit topologies can be used to set the correct output value during the precharge phase.

For another example, the timing relations do not have to be as simple as those described above. Optionally some skew and/or gap in timing between the two preset gates and start of steady-state driver operation, or the different transistors which are all shown gated by SW can be skewed from each other.

For another example, the precharge phase can be run repeatedly, to avoid long-term drift in the output voltage.

None of the description in the present application should be read as implying that any particular element, step, or function is an essential element which must be included in the claim scope: The scope of the patented subject matter is defined only by the allowed claims. Moreover, none of these claims are intended to invoke paragraph six of 35 USC section 112 unless the exact words "means for" are followed by a participle.

The claims as filed are intended to be as comprehensive as possible, and no subject matter is intentionally relinquished, dedicated, or abandoned.

What is claimed is:

1. An integrated circuit comprising:
   multiple voltage generation stages, each respectively connected to receive a reference input, and
   configured to control electrical drive to a respective output connection, during at least some times, using a differential stage which is driven by a feedback input which is not DC-coupled to said output connection, and
   configured to directly drive said output connection, during at least some other times, while also precharging said feedback input to place said differential stage in a high-gain operating regime.

2. An integrated circuit comprising:
   at least one voltage reference stage; and
   multiple secondary voltage generation stages, respectively connected to receive at least one reference input which is derived from said voltage reference stage, and
   configured to control drive to a respective output connection, during an active phase, using a differential stage which is driven by a feedback input which is not DC-coupled to said output connection, and
   configured to directly drive said output connection, during a precharge phase, while also precharging said feedback input to place said differential stage in a high-gain operating regime.

3. A voltage control circuit, comprising:
   a first stage which drives an output connection toward a fixed voltage during a first phase of operation, but not during a second phase of operation; and
   a differential stage which drives said output connection toward said fixed voltage during said second phase, in dependence on a capacitively-divided fraction of the voltage of said output connection which is not DC-coupled to said output connection;
   wherein said first stage also precharges said differential stage, during at least some times other than said second phase of operation.

4. A voltage control circuit, comprising:
   means for, during steady-stage operation, controlling drive to an output connection using a differential stage which is driven by an AC feedback input, and not by a DC feedback input; and
   means for, outside of said steady-state operation, precharging the voltage of said output connection and also precharging said AC feedback input to place said differential stage in a desired operating regime.

5. A voltage generation circuit, comprising:
   a low-power drive stage which, when active, drives a node toward a desired voltage, but which is not DC-stable; and an additional drive stage which is DC-stable, which consumes more power than said low-power drive stage, and which drives said node toward said desired voltage during at least some times when said low-power stage is not active;

wherein said low-power drive stage is also sometimes connected, when not active, to precharge circuitry which biases said low-power stage to a desired operating point.

6. A circuit comprising:

a differential amplifier having a first input terminal, a second input terminal, and an output terminal, wherein the first input terminal is connected to a voltage source supplying a reference voltage level;

an output node, wherein in a first operational stage of the circuit, the output node is charged by a pre-charge circuit to an output voltage level, and in a second operation stage of the circuit, the pre-charge circuit is shut off; and a capacitor divider having a first node in common with the output node, and a second node in common with the second input terminal, wherein in the first operational stage of the circuit the output terminal is connected to the second input terminal, whereby the differential amplifier drives the second node to the reference voltage level, and in the second operational stage of the circuit, the voltage level at the second node is maintained at the reference voltage level by the capacitor divider and a non DC coupled feedback to the differential amplifier.

7. The circuit of claim 6 further comprising a pull-up transistor in communication with a voltage source and the output node, whereby the pull-up transistor is driven by the differential amplifier to maintain the output node at the output voltage level in response to changes in an output load.

8. The circuit of claim 6 further comprising a pull-down transistor connected to a ground terminal and the output node, whereby the pull-down transistor is driven by the differential amplifier to maintain the output node at the voltage output level in response to changes in an output load.

9. The circuit of claim 6 wherein the pre-charge circuit comprises a current source and a resistor.

10. The circuit of claim 6 wherein the non DC coupled feedback includes a pull-up transistor having a gate controlled by the differential amplifier.

11. The circuit of claim 6 wherein the non DC coupled feedback includes a pull-up transistor having a gate controlled by the differential amplifier.

12. The circuit of claim 6 further comprising a switch for connecting the output terminal to the second input terminal.

13. The circuit of claim 6 further comprising a switch for connecting the output node to the pre-charge circuit.

14. The circuit of claim 6 further comprising a switch to shut-off the pre-charge circuit.

15. The circuit of claim 6 wherein the capacitive divider comprises a first capacitor (C1) and a second capacitor (C2), wherein a ratio of a voltage at the second node to the output voltage level is C1/(C1+C2).

16. A circuit comprising:

an output node;

a first stage to precharge the output node at an output voltage level; and a second stage to maintain the output node at the output voltage level when the first stage is powered down; and wherein the second stage includes a non DC coupled feedback that includes the output node.

17. The circuit of claim 16 wherein the first stage comprises a current source, and the second stage comprises a differential amplifier.

18. The circuit of claim 16 wherein the non DC coupled feedback includes a capacitive divider.

19. The circuit of claim 18 wherein the capacitive divider comprises a first capacitor (C1) and a second capacitor (C2), wherein a ratio of a voltage level at a node between the first capacitor and the second capacitor to the output voltage level is C1/(C1+C2).

20. The circuit of claim 16 wherein the non DC coupled feedback includes a pull-up transistor.

* * * * *

UNITED STATES PATENT AND TRADEMARK OFFICE
CERTIFICATE OF CORRECTION

PATENT NO. : 7,492,214 B2  Page 1 of 1
APPLICATION NO. : 11/618918
DATED : February 17, 2009
INVENTOR(S) : Feng Pan It is certified that error appears in the above-identified patent and that said Letters Patent is hereby corrected as shown below:

Column 5, claim 6, line 18, before "divider having a first" delete "capacitor" and substitute --capacitive-- in its place.

Column 5, claim 6, line 26, after "voltage level by the" delete "capacitor" and substitute --capacitive-- in its place.

Column 6, claim 11, line 5, after "feedback includes a" delete "pull-up" and substitute --pull-down-- in its place.

Signed and Sealed this

Sixteenth Day of March, 2010

David J. Kappos
*Director of the United States Patent and Trademark Office*